United States Patent [19]
Alexander et al.

[11] Patent Number: 6,154,027
[45] Date of Patent: *Nov. 28, 2000

[54] MONOLITHIC MAGNETIC SENSOR HAVING EXTERNALLY ADJUSTABLE TEMPERATURE COMPENSATION

[75] Inventors: Alasdair G. W. Alexander, Andover; Paul R. Nickson, Topsfield; David P. Foley, Chelmsford, all of Mass.

[73] Assignee: Analog Devices, Inc., Norwood, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/953,884

[22] Filed: Oct. 20, 1997

[51] Int. Cl.⁷ .......................... G01R 33/07; H01L 43/06; H03K 17/95
[52] U.S. Cl. ................ 324/251; 324/207.12; 324/207.2; 324/225; 323/368; 327/511
[58] Field of Search .......................... 324/207.12, 207.2, 324/207.21, 225, 251, 173, 174; 327/510–513; 73/DIG. 3; 323/368

[56] References Cited

U.S. PATENT DOCUMENTS

| | | | |
|---|---|---|---|
| 4,734,594 | 3/1988 | Nelson | 307/309 |
| 4,760,285 | 7/1988 | Nelson | 324/251 |
| 4,804,957 | 2/1989 | Selph et al. . | |
| 5,250,881 | 10/1993 | Yoshino . | |
| 5,317,259 | 5/1994 | Kotter et al. | 324/251 |
| 5,389,889 | 2/1995 | Towne et al. | 330/6 |
| 5,406,202 | 4/1995 | Mehrgardt et al. | 324/251 |
| 5,589,792 | 12/1996 | Brokaw | 327/512 |
| 5,604,433 | 2/1997 | Theus et al. | 324/251 |
| 5,621,319 | 4/1997 | Bilotti et al. | 324/251 |
| 5,818,225 | 10/1998 | Miekley et al. | 324/251 |
| 5,900,995 | 5/1999 | Akada et al. . | |

FOREIGN PATENT DOCUMENTS

| | | | |
|---|---|---|---|
| 3827606A1 | 3/1989 | Germany | H01L 23/56 |
| 2310046 | 8/1997 | United Kingdom | G01R 33/07 |

OTHER PUBLICATIONS

Offset Reduction in Spinning–Current Hall Plates, A. A. Bellekom et al., Sensors and Materials, 5, 5, pp. 253–263, 1994 (no month).

Monolithic Magnetic Hall Sensor Using Dynamic Quadrature Offset Cancellation, A. Bilotti, Life Senior Member, IEEE Journal of Solid State Circuits, vol. 32, No. 6, Jun. 1997.

Primary Examiner—Gerard Strecker
Attorney, Agent, or Firm—Wolf, Greenfield & Sacks, P.C.

[57] ABSTRACT

The current flow from a temperature-variable current source to a Hall-effect element is adjusted according to sensed temperature conditions of the element to compensate for temperature-dependent changes in the magnetic-field sensitivity of the Hall-effect element and in the magnitude of the permanent magnetic fields of magnetic components sensed by the element. A trimmable resistor is connected between two external terminals of a Monolithically integrated circuit to provide external control over the sensitivity of the temperature variable current source to changing temperature conditions. The device also alternately switches the quadrature states of output and bias supply contacts of the Hall-effect element to compensate for the offset and drift thereof.

48 Claims, 8 Drawing Sheets

MONOLITHIC MAGNETIC SENSOR HAVING EXTERNALLY ADJUSTABLE TEMPERATURE COMPENSATION

BACKGROUND OF THE INVENTION

1. Field of the Invention

The present invention relates to magnetic sensors and, more particularly, to a Hall-effect sensor arrangement having temperature compensation circuitry that is user-adjustable.

2. Discussion of Related Art

Hall-effect elements are used to sense magnetic fields. In its simplest form, a monolithically fabricated Hall-effect element employs a square plate formed, for example, of an epitaxial (epi) pocket formed in a bipolar (BP) or bipolar complementary metal oxide semiconductor (BiCMOS) process. The square plate has two pairs of contacts oriented such that each pair of contacts straddles the plate from a different pair of its diametrically opposing corners. When a current $I_H$ is caused to flow between one of the two pairs of contacts, a voltage $V_H$ will appear across the other pair of contacts. The voltage $V_H$ is a function of: (a) the amplitude of the current $I_H$, (b) the strength of a magnetic field B, if any, intercepting the Hall plate, and (c) the sensitivity $S_H$ of the Hall plate to the magnetic field B (i.e., $V_H = I_H * B * S_H$, where * denotes the multiplication operator). Thus, when properly calibrated, a Hall plate may be used to measure the strength of a magnetic field B by applying a known current $I_H$ between one pair of contacts of a Hall plate and measuring the voltage $V_H$ across the other pair of contacts.

There are two major difficulties encountered when using Hall plates to sense magnetic fields. One difficulty arises because a Hall plate includes unavoidable imperfections, such as geometrical asymmetries, that cause the Hall plate to produce a non-zero output voltage $V_H$ in the absence of any applied magnetic field B. This voltage $V_H$ generated when B=0 commonly is referred to as the offset voltage $V_{OH}$ of the Hall plate. A discussion of the Hall effect, the operation of Hall-effect elements, circuits in which Hall-effect elements may be used, and various techniques for addressing the problem of Hall plate offset voltage are discussed in the following patents and publications, each of which is incorporated herein by reference: Bilotti et al., U.S. Pat. No. 5,621,319; Mehrgardt et al., U.S. Pat. No. 5,406,202; Bilotti, Albert, "Monolithic Magnetic Hall Sensor Using Dynamic Quadrature Offset Cancellation," *IEEE Journal of Solid-State Circuits*, Vol. 32, No. 6, June 1997; Bellekom, A. A., and Munter, P. J. A., "Offset Reduction in Spinning-Current Hall Plates," *Sensors and Materials*, 5, 5 (1994) 253–263, MYU Tokyo; Baltes, H. P., and Popovic, R. S., "Integrated Semiconductor Magnetic Field Sensors," *Proc. IEEE*, vol. 74, pp. 1107–1132, August 1986.

A second difficulty arises due to the fact that the sensitivity $S_H$ of a Hall-effect element changes as the temperature of the element changes. Therefore, for a given current $I_H$ and magnetic field B, the voltage $V_H$ produced by a Hall-effect element will vary depending on the temperature of the element. Because of this temperature-dependency, the actual magnitude of the magnetic field B is difficult to ascertain when a Hall-effect element is used in an environment wherein its temperature is not held constant.

In addition, Hall-effect elements often are used to sense the permanent magnetic fields of components. For example, a Hall-effect element may be used to sense the position of a magnetic component while it is rotating or otherwise in motion relative to the Hall-effect element. Because the magnitude of a magnetic field emanating from a magnetic component changes as the temperature of the component changes, for any given position of the component with respect to the Hall-effect element, the magnitude of the output voltage $V_H$ of the Hall-effect element when the component is at a first temperature will not be the same as the output voltage $V_H$ when the component is at a second temperature. Therefore, the magnitude of the output voltage $V_H$ of a Hall-effect element does not provide a reliable indication of the position of a magnetic component when the component is subjected to a variable-temperature environment.

It therefore is a general object of the present invention to provide a Hall effect device having improved immunity to the effects of a variable-temperature environment.

SUMMARY OF THE INVENTION

According to one aspect of the present invention, a Hall effect device includes a substrate mounted within an integrated circuit package, a Hall-effect element integrated on the substrate, and a pair of terminals adapted to interface with a component external to the package. The pair of terminals is arranged with respect to the Hall-effect element such that, when the component is coupled to the pair of terminals, a characteristic of the component may be changed to adjust the sensitivity of the gain of the Hall effect device to temperature changes in the device.

According to another aspect, the Hall effect device includes a temperature-variable signal source arranged to provide the bias signal such that a value of the bias signal changes in response to temperature changes in the Hall-effect element. Additionally, the pair of terminals is arranged with respect to the signal source such that, when the component is coupled to the pair of terminals, the characteristic of the component may be changed to adjust the sensitivity of the signal source to temperature changes in the Hall-effect element.

According to another aspect of the invention, a Hall-effect device includes an integrated circuit package having a Hall-effect element mounted within it, and a user-accessible component arranged with respect to the Hall-effect element such that a characteristic of the component may be changed to adjust the sensitivity of the gain of the Hall-effect device to temperature changes in the device.

According to another aspect a Hall-effect device includes a Hall effect device mounted in an integrated circuit package and means for adjusting the sensitivity of the gain of the Hall-effect device to changing temperature conditions from a point external to the package.

According to yet another aspect of the invention, a method for compensating for the effects of temperature variations on a Hall-effect element includes coupling a component to a pair of external terminals of an integrated circuit to adjust the sensitivity of the gain of a Hall-effect device included in the integrated circuit.

DETAILED DESCRIPTION OF THE INVENTION

Figure 1:
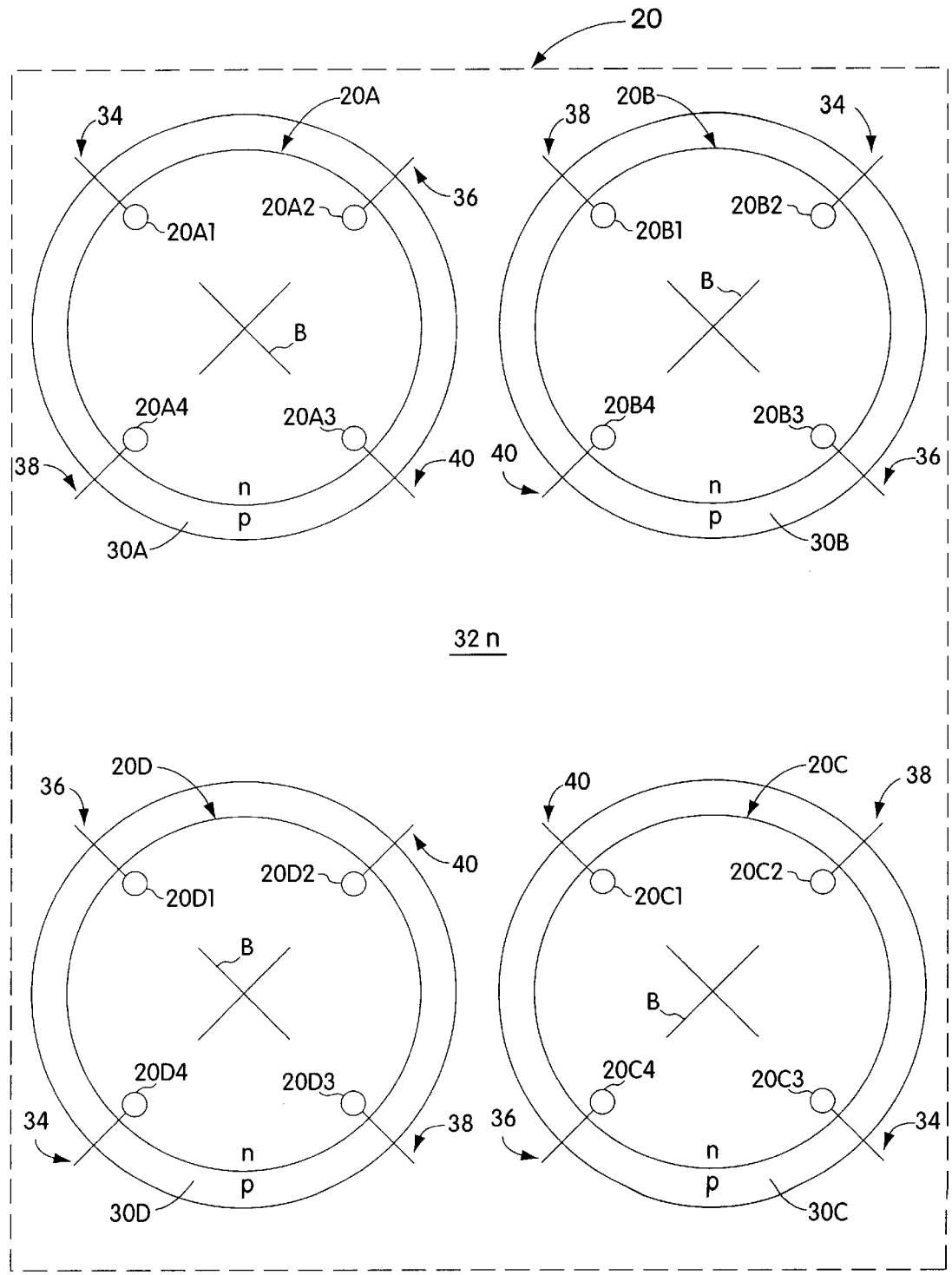
FIG. 1 is a top-view of a quad-cell Hall-effect element used in one embodiment of the invention.

FIG. 1 is a top-view of a quad-cell Hall-effect element 20 used in one embodiment of the invention. As shown, quad-cell Hall-effect element 20 includes four Hall cells 20A–20D. Hall cells 20A, 20B, 20C and 20D are made of n-type epitaxial (n-epi) regions (e.g., 200 micrometers in diameter) formed within p-type wells or tubs (p-wells/p-tubs) 30A, 30B, 30C and 30D, respectively. P-wells/p-tubs 30A, 30B, 30C and 30D, in turn, are formed on an n-type substrate 32.

Each of Hall cells 20A, 20B, 20C and 20D includes two pairs of orthogonally oriented contacts. Specifically, Hall cells 20A, 20B, 20C and 20D, include, respectively, first pairs, of contacts 20A1 and 20A3, 20B1 and 20B3, 20C1 and 20C3, and 20D1 and 20D3, and second pairs of contacts 20A2 and 20A4, 20B2 and 20B4, 20C2 and 20C4, and 20D2 and 20D4. Conductor 34 interconnects contacts 20A1, 20B2, 20C3 and 20D4, conductor 36 interconnects contacts 20A2, 20B3, 20C4 and 20D1, conductor 38 interconnects contacts 20A4, 20B1, 20C2 and 20D3, and conductor 40 interconnects contacts 20A3, 20B4, 20C1 and 20D2, thereby wiring cells 20A–20D in parallel such that each of cells 20A–20D is oriented orthogonally with respect to the other cells in quad-cell Hall-effect element 20. This orientation of cells 20A–20D reduces the adverse effects of imperfections, such as processing gradients, in the cells.

FIG. 1 also shows how each of cells 20A–20D may be intercepted by a magnetic field B, which is shown as entering the surface of the cells in a direction normal and into the page. If a current $I_H$ were applied between conductors 34 and 40, for example, then the magnitude of magnetic field B and the sensitivity $S_H$ of the Hall-effect element would determine a magnitude of a voltage $V_H$ created between conductors 36 and 38 according to the equation $V_H = I_H * B * S_H$, discussed above.

Figure 2:
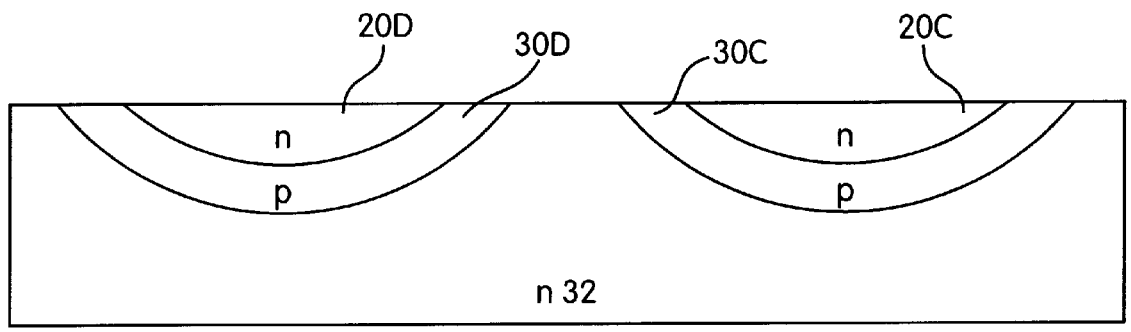
FIG. 2 is a side cross-sectional view of the substrate portion of the quad-cell Hall cell shown in FIG. 1.

FIG. 2 is a side cross-sectional view of the substrate portion of the quad-cell Hall-effect element 20 shown in FIG. 1. As shown, p-wells/p-tubs 30D and 30C are formed within, an n-type substrate 32, and n-EPI Hall cells 20C and 20D are formed within p-wells/p-tubs 30C and 30D, respectively. The letters "p" and "n" in FIGS. 1 and 2 are intended only to illustrate the doping types of the various regions, and are not intended to signify the amounts by which the regions are doped or the process by which the regions were formed.

Figure 3:
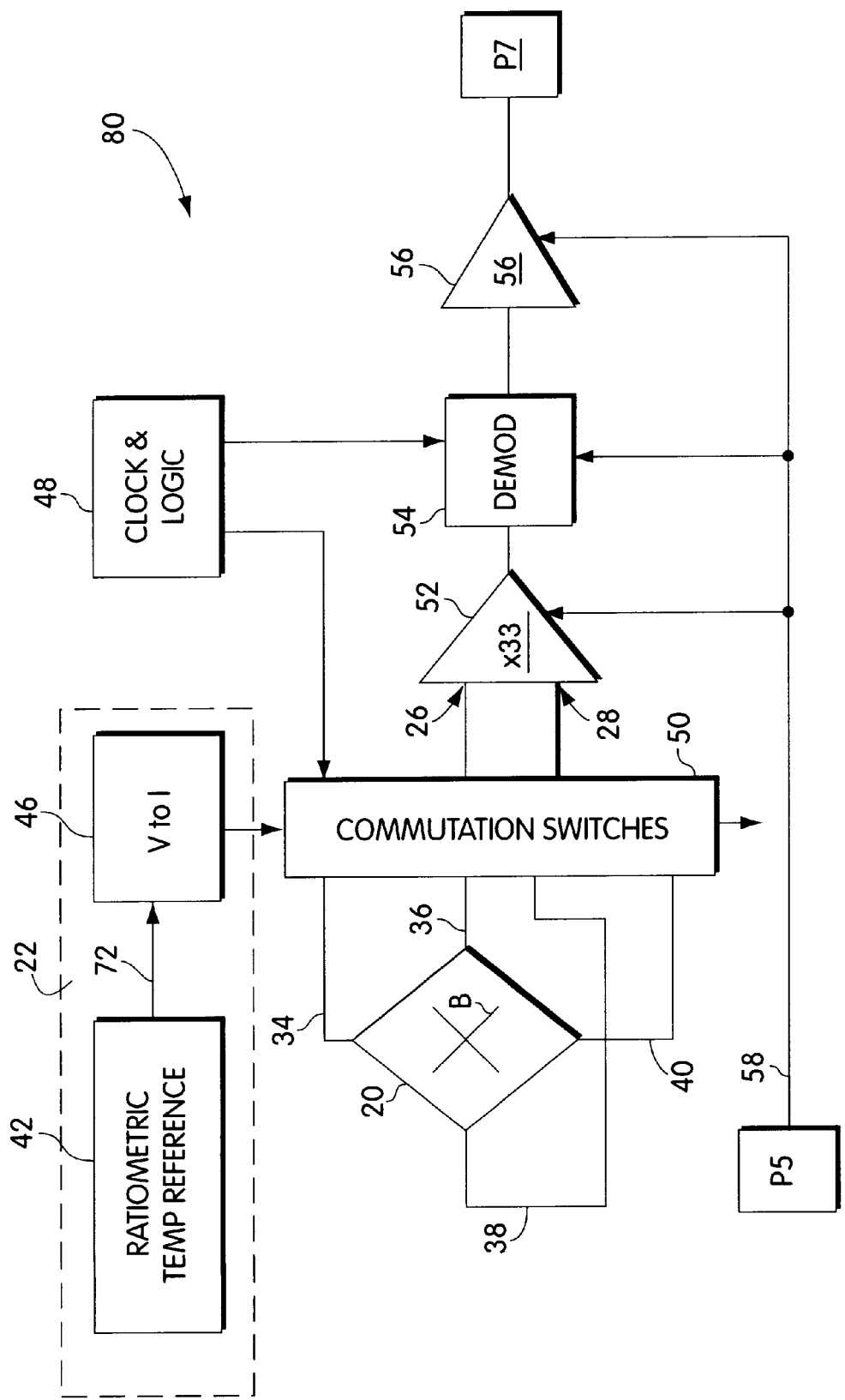
FIG. 3 is a block diagram of one embodiment of a Hall-effect device according to the invention.

FIG. 3 is a block diagram of one embodiment of a Hall-effect device 80 according to the invention. As shown, Hall-effect device 80 includes quad-cell Hall-effect element 20, commutation switches 50, a differential pre-amplifier 52, a demodulator 54, an output amplifier 56, an output terminal P7, a reference terminal P5, a temperature-variable current source 22 (which includes a ratiometric temperature reference block 42 with an output 72 coupled to a control input of a voltage-to-current converter 46), and a clock and logic stage 48.

The operation of circuit 80 is discussed in more detail below in connection with a description of its various portions, but FIG. 3 is useful to understand the basic operation of Hall-effect device 80. As shown, temperature-variable current source 22 supplies a Hall bias current $I_H$ which varies according to the temperature of the device to commutation switches 50. Commutation switches 50 are controlled by clock and logic stage 48 to commutate the current $I_H$ alternately (1) between conductors 34 and 40, and (2) between conductors 36 and 38. When the current $I_H$ is presented between conductors 34 and 40, commutation switches 50 concurrently apply the voltage generated between conductors 36 and 38 (responsive to the magnetic field B) to inputs 26 and 28, respectively, of differential pre-amplifier 52; and when the current $I_H$ is presented between conductors 36 and 38, commutation switches 50 concurrently apply the voltage generated between conductors 34 and 40 (responsive to the magnetic field B) to inputs 26 and 28, respectively, of differential pre-amplifier 52. This commutation of signals to and from quad-cell Hall-effect element 20 is performed to eliminate the inherent voltage offset $V_{OH}$ of the Hall cells, and is discussed in detail in several of the documents referred to and incorporated by reference above. Suffice it to note, however, that the flowing of current in a first direction across a Hall cell generates a first voltage $V_1$ including a first Hall voltage $V_{H1}$ and a first Hall offset voltage $V_{OH2}$ ($V_1 = V_{H1} + V_{OH1}$), and the flowing of current across a Hall cell in a second direction, which is oriented orthogonally to the first direction, generates a second voltage $V_2$ including a second Hall voltage $V_{H2}$ and a second Hall offset voltage $V_{OH2}$ ($V_2 = -V_{H2} + V_{OH2}$).

Because the second hall voltage $V_{H2}$ is approximately equal to and of an opposite sign as the first Hall voltage $V_{H1}$ (i.e., $V_{H2} = V_{H1} = V_H$) and the second Hall offset voltage $V_{OH2}$ is approximately equal to and the same sign as the first Hall offset voltage $V_{OH1}$ (i.e., $V_{OH2} = V_{OH1} = V_{OH}$), a subtraction of the voltage $V_2$ generated by the current flowing in the second direction from the voltage $V_1$ generated by the current flowing in the first direction (i.e., $(V_{H1} + V_{OH1}) - (-V_{H2} + V_{OH2})$) effectively cancels the offset voltage so that only a voltage equal to $2V_H$ results. As explained below, this subtraction is performed by a combination of pre-amplifier 52 and demodulator 54. The offset-free output of demodulator 54 then is provided to the input of rail-to-rail output amplifier 56, and the output of amplifier 56 feeds external terminal P7 (e.g., a pin) of the device. As described below, the gain of amplifier 56 is adjusted using resistors external to device 80.

The effect of temperature on the sensitivity of quad-cell Hall-effect element 20 is compensated by adjusting the magnitude of the Hall bias current $I_H$ supplied to commutation switches 50. That is, because the voltage $V_H$ produced at the output of Hall-effect element 20 is proportional to the magnitude of the current flowing through the element as well as to the sensitivity constant $S_H$ (i.e., $V_H=I_H*B*S_H$), an increase or decrease in sensitivity $S_H$ due to a temperature change may be countered by a corresponding decrease or increase, respectively, in Hall current $I_H$. The output voltage $V_H$ therefore always will be the same for a given magnitude of magnetic field B, regardless of the temperature of the Hall-effect device 80.

Similarly, an increase or decrease in the magnetic field strength B of a magnetic component being sensed by device 80 due to a temperature change may be countered by a corresponding decrease or increase, respectively, in the Hall current $I_H$. This is useful when the magnetic field is produced by a moving permanent magnet. Thus, regardless of the temperature of the environment in which the magnetic component and Hall-effect device 80 are disposed, the output voltage $V_H$ of Hall-effect device 80 always will be the same when the moving (e.g., rotating) component being sensed is a given distance from device 80.

Figure 4:
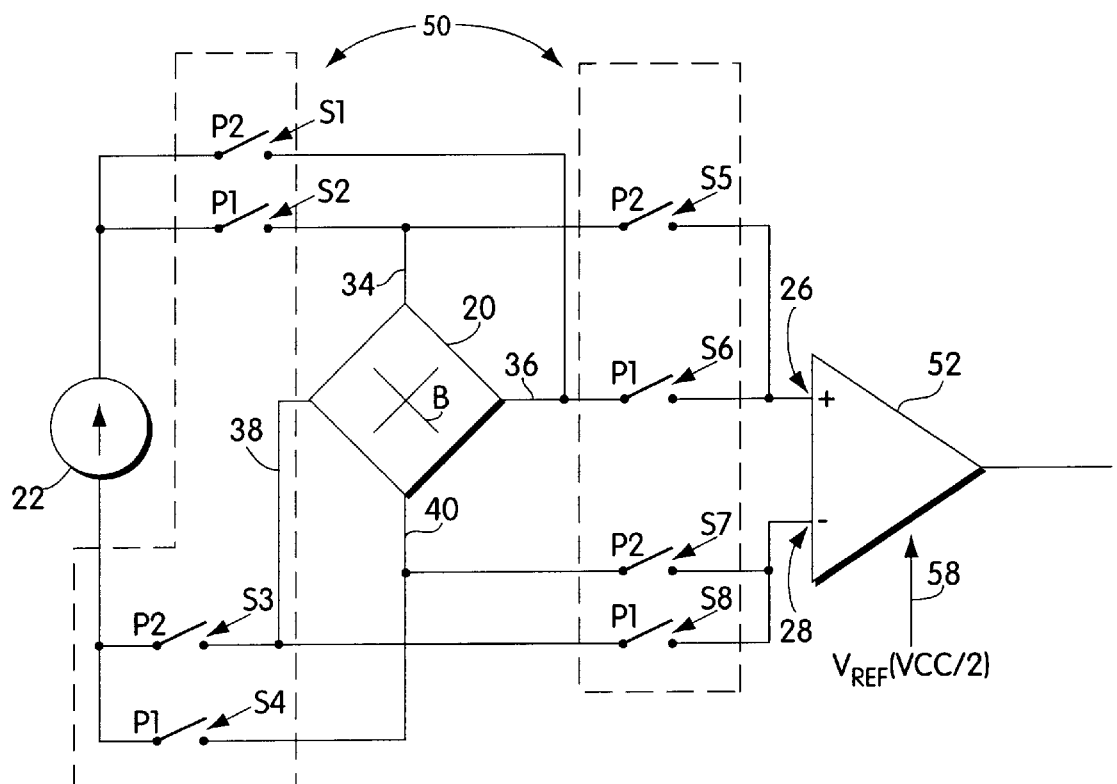
FIG. 4 is a partial schematic/partial block diagram showing in more detail a commutation switch portion of the device shown in FIG. 3.

FIG. 4 is a partial schematic/partial block diagram showing commutation switches 50 and their surrounding circuitry in more detail. As shown, commutation switches 50 include switches S1–S8. Switches S1 and S2 are connected between a first polarity output of temperature-variable current source 22 and conductors 36 and 34, respectively, of quad-cell Hall-effect element 20, and switches S3 and S4 are connected between a second polarity output of temperature-variatble current source 22 and conductors 38 and 40, respectively, of Hall-effect element 20. Similarly, switches S5 and S6 are connected, respectively, between conductors 34 and 36 of Hall-effect element 20 and non-inverting input 26 of pre-amplifier 52, and switches S7 and S8 are connected, respectively, between conductors 40 and 38 of Hall-effect element 20 and inverting input 28 of pre-amplifier 52. As explained below, the symbol "P1" or "P2" next to switches S1–S8 indicates which of two phases of a control signal from clock and logic stage 48 (shown in FIG. 3) causes each of the switches to close. In addition to receiving signals at non-non-inverting input 26 and inverting input 28, pre-amplifier 52 receives a reference voltage $V_{REF}$ from reference conductor 58. The reference voltage $V_{REF}$ is created within Hall-effect device 80 and is set to be one-half of the high-supply voltage VCC of device 80 (i.e., $V_{REF}$=VCC/2). The high-supply voltage VCC is approximately 5 volts, so the reference voltage $V_{REF}$ is set to approximately 2.5 volts. The operation of the circuitry shown in FIG. 4 is described below in connection with the description of the timing diagram shown in FIG. 6.

Figure 5:
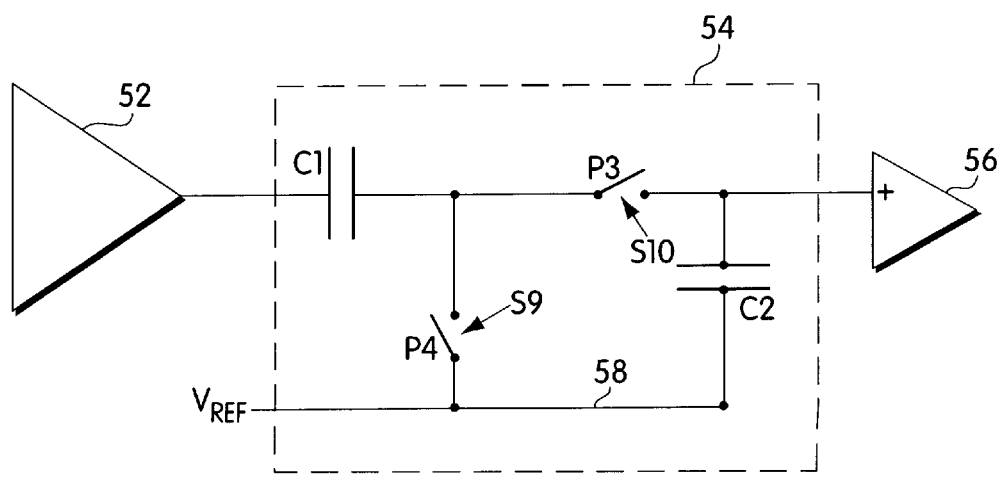
FIG. 5 is a partial schematic/partial block diagram showing in more detail a demodulation portion of the device shown in FIG. 3.

FIG. 5 is a partial schematic/partial block diagram showing demodulation block 54 in more detail. As shown, demodulation block 54 includes capacitors C1 and C2 and switches S9 and S10. Capacitor C1 is connected between a single-ended output of differential pre-amplifier 52 and one terminal of each of switches S9 and S10. The other terminal of switch S9 is connected to reference conductor 58 (which is maintained at $V_{REF}$), and the other terminal of switch S10 is connected to a non-inverting input of output amplifier 56. Capacitor C2 is connected between the non-inverting input of amplifier 56 and conductor 58.

Figure 6:
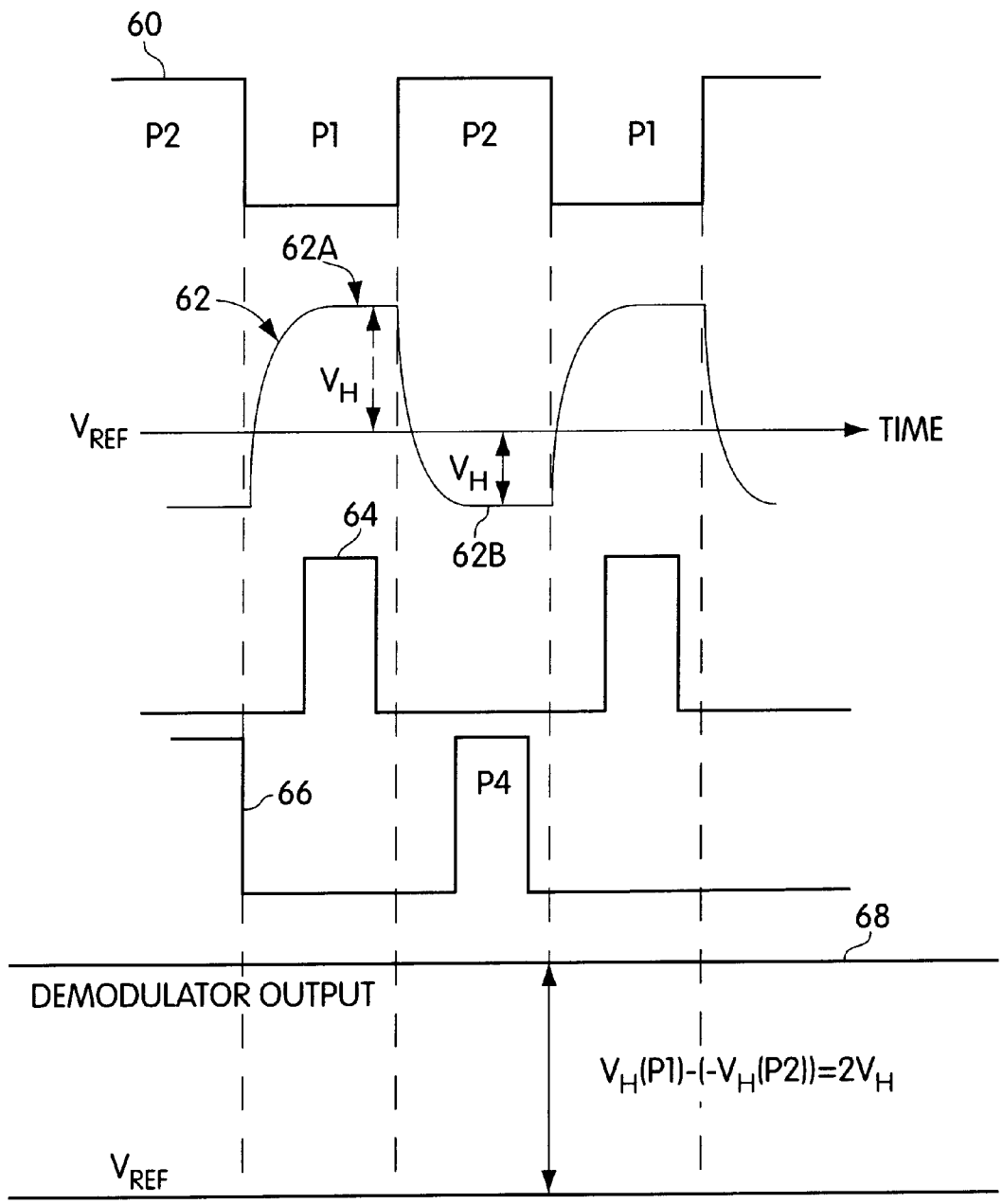
FIG. 6 is a timing diagram showing control and output signals of the portions of the device shown in FIGS. 4 and 5.

FIG. 6 is a timing diagram showing control signals for switches S1–S10 and output signals of pre-amplifier 52 and demodulator 54 shown in FIGS. 4 and 5. Specifically, the timing diagram of FIG. 6 illustrates: (1) commutation clock signal 60, (2) pre-amplifier output signal 62, (3) switch S10 control signal 64, (4) switch S9 control signal 66, and (5) demodulator output signal 68. The vertical axis of each of these signals represents an amplitude attained by the signal and the horizontal axis represents time. While all of the signals shown in FIG. 6 share a common time axis, the placement of one signal above another is not intended to indicate that the signal attains a higher amplitude than do the others.

Referring now to FIG. 4 in conjunction with FIG. 6, the operation of the portion of Hall-effect device 80 shown in FIG. 4 will be explained. As shown, commutation clock 60 has two phases, P1 and P2. Specifically, when clock 60 is low, it is in phase P1, and when clock 60 is high, it is in phase P2. Each of switches S1–S8 is arranged to be closed during only one of these two phases. That is, switches S2, S4, S6 and S8 are closed during phase P1 (when clock 60 is, low) and switches S1, S3, S5 and S7 are closed during phase P2 (when clock 60 is high). The phase during which each of the switches is closed is indicated next to the switch by the symbol "P1" or "P2."

During phase P1 of clock 60, temperature-variable current source 22 is connected between conductors 34 and 40 of Hall-effect element 20 and conductors 36 and 38 of Hall-effect element 20 are connected, respectively, to non-inverting input 26 and inverting input 28 of differential pre-amplifier 52. Pre-amplifier 52 amplifies the differential voltage between its non-inverting input 26 and its inverting input 28, and effectively adds the amplified input voltage (which is positive during phase P1) to the reference voltage $V_{REF}$ on conductor 58. Pre-amplifier 52 then provides this sum of voltages as a single-ended output signal (shown as pre-amplifier output signal 62 in FIG. 6). As shown, pre-amplifier output signal 62 is greater than $V_{REF}$ during phase P1 (e.g., as indicated by portion 62A of curve 62).

During phase P2 of clock 60, temperature-variable current source 22 is connected between conductors 36 and 38 of Hall-effect element 20 and conductors 34 and 40 of Hall-effect element 20 are connected, respectively, to non-inverting input 26 and inverting input 28 of differential pre-amplifier 52. Pre-amplifier 52 amplifies the differential voltage between its non-inverting input 26 and its inverting input 28, and effectively adds the amplified input voltage (which is negative during phase P2) to the reference voltage $V_{REF}$ on conductor 58. Pre-amplifier 52 then provides this sum of voltages as a single-ended output signal (shown as pre-amplifier output signal 62 in FIG. 6). As shown, pre-amplifier output signal 62 is less than $V_{REF}$ during phase P2 (e.g., as indicated by portion 62B of curve 62).

Generally, due to the offset voltage $V_{OH}$ of Hall-effect element 20, portions 62A and 62B, respectively, of curve 62 will not be the same voltage greater than ($V_H$) and less than ($-V_H$) the voltage $V_{REF}$ during phases P1 and P2. Demodulator 54 deals with this difference by effectively subtracting the voltage $-V_H$ at the output of pre-amplifier 52 during phase P2 from the voltage $V_H$ at the output of pre-amplifier 52 during phase P1, thereby removing the effects of the Hall offset voltage $V_{OH}$, as described above.

Referring now to FIG. 5 in conjunction with FIG. 6, the operation of demodulator 54 will be described. Clock and logic stage 48 (shown in FIG. 3) produces switch S9 control signal 66 and switch S10 control signal 64 as shown in FIG. 6. Switches S9 and S10 are arranged such that they are closed, respectively, during phase P4 of switch S9 control signal 66 and during phase P3 of switch S10 control signal 64 (i.e., when switch S9 control signal 66 and switch S10 control signal 64, respectively, are high). The phase during which each of switches S9 and S10 is closed is indicated next to the switch by the symbol "P4" or "P3."

During phase P4, switch S9 is closed during a brief time interval while the output of pre-amplifier 52 is negative with respect to $V_{REF}$ so that capacitor C1 will charge to the current voltage at the output of pre-amplifier 52 with respect to the voltage $V_{REF}$. During phase P3, after switch S9 has opened, switch S10 is closed during a brief time interval while the output of pre-amplifier 52 is positive with respect to $V_{REF}$. Because capacitors C1 and C2 are connected in series during this interval, some of the charge on capacitor C1 will be transferred to capacitor C2. After several P4/P3 cycles, the charge on capacitor C2 will be equal to the peak-to-peak voltage of curve 62.

In this manner, demodulator circuit 54 effectively subtracts (a) the negative difference between the amplitude of the voltage at the output of pre-amplifier 52 and reference voltage $V_{REF}$ during phase P2 from (b) the positive difference between the amplitude of pre-amplifier 52 and reference voltage $V_{REF}$ during phase P1. The output of demodulator circuit 54, i.e., the pole of capacitor C2 that is connected to the non-inverting input of output amplifier 56, therefore remains at a positive voltage equal to the peak-to-peak voltage of curve 62. As discussed above, this peak-to-peak voltage has the Hall offset voltage $V_{OH}$ removed from it.

Figure 7:
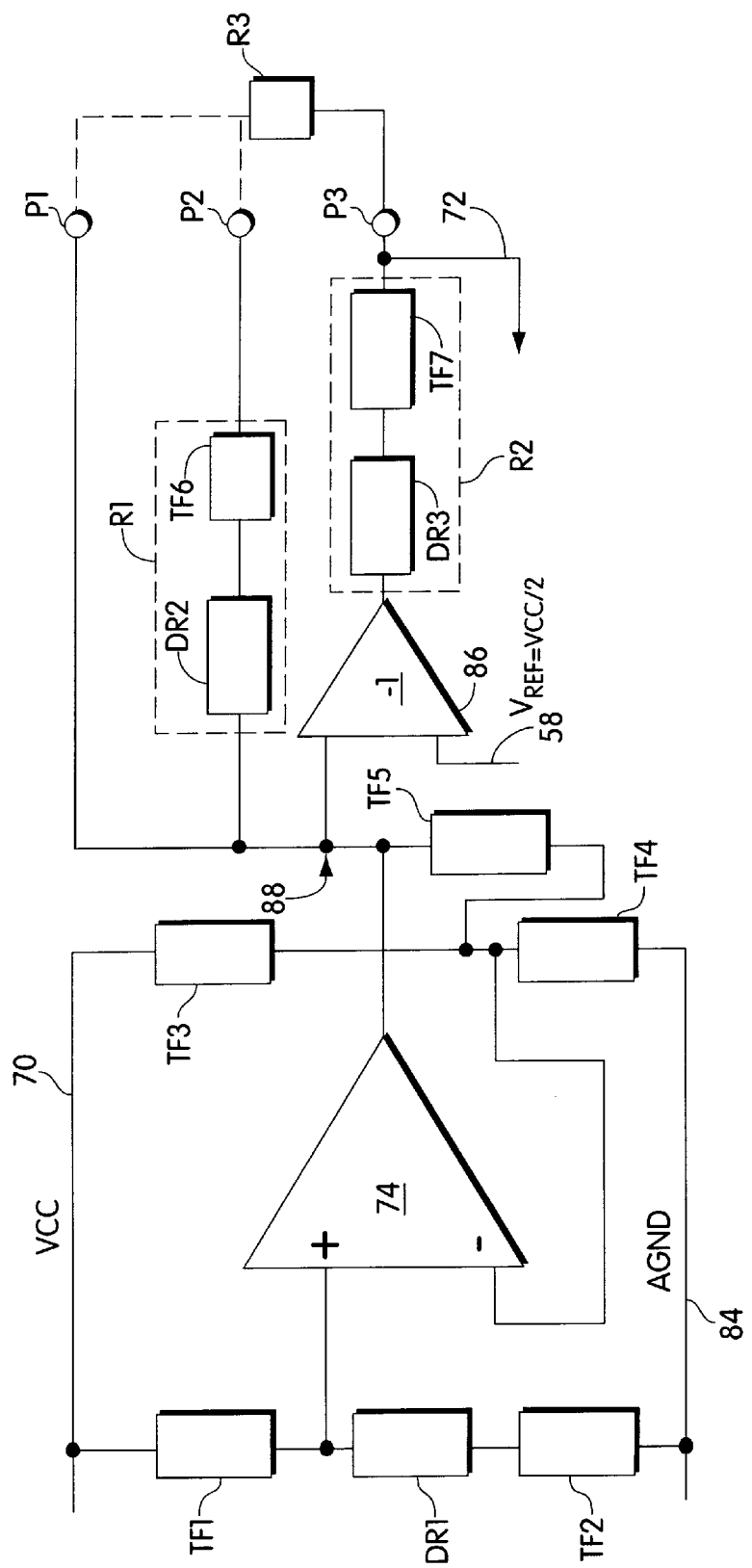
FIG. 7 is a schematic diagram showing in more detail the ratiometric temperature reference portion of the circuit shown in FIG. 3.

FIG. 7 is a schematic diagram showing ratiometric temperature reference block 42 in more detail. As shown, ratiometric temperature reference stage 42 includes operational amplifiers 74 and 86, temperature-sensitive n+ diffusion resistor DR1, temperature-sensitive p-well diffusion resistors DR2 and DR3, and thin film resistors TF1–TF7, which are not particularly sensitive to temperature changes.

A resistive bridge including diffusion resistor DR1 and thin-film resistors TF1 and TF2 is connected between high-supply rail 70 (which has a voltage VCC thereon) and an analog ground 84. Specifically, thin film resistor TF1 is connected between high-supply rail 70 and a non-inverting input of operational amplifier 74, and resistors DR1 and TF2 are connected in series between the non-inverting input of operational amplifier 74 and analog ground 84. The non-inverting input of operational amplifier 74 therefore is maintained at a voltage that changes in proportion to changes in the supply voltage (i.e., it is a ratiometric differential reference voltage).

Resistors TF3 and TF4 are connected in series between high-supply rail 70 and analog ground 84, and the connection point of these resistors is connected to the inverting input of operational amplifier 74. Resistor TF5 is connected in feedback between the output and the inverting input of operational amplifier 74. The values of resistors TF3–TF5 therefore control the gain of operational amplifier 74.

The output of operational amplifier 74 feeds node 88. Node 88, in turn, is connected to: (1) an external terminal P1, (2) one terminal of a first divider resistor R1 (including series-connected resistors DR2 and TF6), the other terminal of which is connected to an external terminal P2, and (3) one input of unity-gain inverting operational amplifier 86, the other input of which is connected to conductor 58 (which has the voltage $V_{REF}$ applied on it). Thus, operational amplifier 86 will produce an output that is equal to the inverted difference between: (a) the voltage at node 88, and (b) the reference voltage VCC/2. As used herein, an "external terminal" refers to a terminal extending outwardly from an integrated circuit package such the terminal may interface with circuitry external to the package.

The output of operational amplifier 86 is connected to one terminal of a second divider resistor R2 (including series-connected resistors DR3 and TF7), the other terminal of which is connected to: (a) an external terminal P3, and (b) conductor 72, which drives a control input of voltage-to-current converter 46 (shown in FIG. 3). Voltage-to-current converter 46 is configured so that a one millivolt change in the voltage applied to its control input results in a 0.04% change in Hall bias current $I_H$ provided to quad-cell Hall-effect element 20 (shown in FIG. 3).

Additionally, a trimmable resistor R3 is selectively connected between external terminal P3 and one of external terminals P1 and P2. Resistor R3 preferably is external to the integrated circuit package in which Hall-effect device 80 is disposed so that its value is user-selectable. Resistor R3 may comprise a simple potentiometer, a thick-film laser trimmable resistor, or any other device having a user-adjustable resistance known to those skilled in the art. It should be noted, however, that resistor R3 also may be included within the same package as Hall-effect device 80 so long as it is readily accessible to an end user of the integrated circuit.

As noted above, the resistance of diffusion resistors DR1, DR2 and DR3 changes responsive to temperature changes. Thus, as the temperature of Hall-effect device 80 increases, the resistance of resistor DR1 will change and the voltage at the output of operational amplifier 74 (node 88) will change accordingly. Assuming initially that resistor R3 is not present, when the voltage at node 88 is equal to VCC/2 (i.e., the voltage on conductor 58), the voltage at each of external terminals P1, P2 and P3 also will be equal to VCC/2. As the voltage at node 88 diverges from VCC/2, however, the voltage at external terminals P1 and P2 will follow the divergence of the voltage at node 88, and the presence of polarity-inverting operational amplifier 86 will cause the voltage at external terminal P3 to diverge in a voltage direction opposite the direction in which the voltage at node 88 diverges from VCC/2. Specifically, the voltage at external terminal P3 will diverge in a positive voltage direction when the voltage at node 88 decreases below VCC/2 and will diverge in a negative voltage direction when the voltage at node 88 increases above VCC/2.

After fabrication of the device, bridge resistors TF1 and TF2, or gain-setting resistors TF3–TF5, may be trimmed using any conventional wafer probing apparatus so that the voltage at node 88 is equal to VCC/2 when the temperature of the Hall-effect device is at an ambient temperature (e.g., approximately 27° Celsius).

Figure 8:
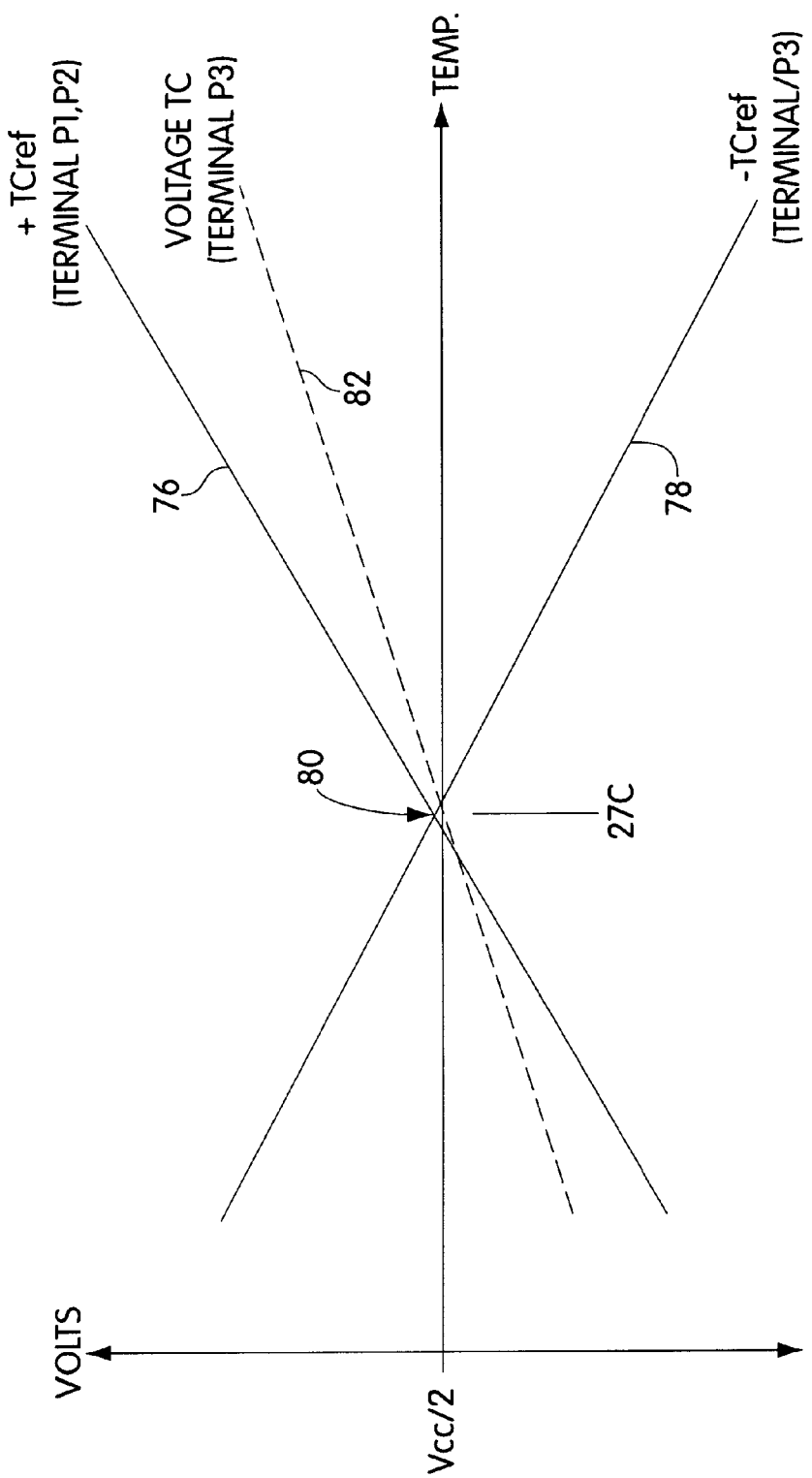
FIG. 8 is a graph showing how voltages produced by the temperature reference portion shown in FIG. 7, which are presented on external pins of the device, vary with temperature.

FIG. 8 is a graph showing how the voltages on external terminals P1, P2 and P3 vary with temperature, both with and without resistor R3 being connected between terminal P3 and one of terminals P1 and P2. As shown, curve 76 represents the voltage on both of external terminals P1 and P2 when resistor R3 is not connected to either of them, curve 78 represents the voltage on external terminal P3 when resistor R3 is not connected to it, and curve 82 represents the voltage on external terminal P3 when resistor R3 is connected between terminal P3 and one of terminals P1 and P2. Curves 76, 78 and 80 are shown as they would appear after bridge resistors TF1 and TF2, or gain-setting resistors TF3–TF5, have been trimmed properly. That is, after selected one of resistors TF1–TF5 have been trimmed properly, curves 76, 78 and 80 will converge at a point 80, which corresponds to an ambient temperature of 27° Celsius.

When resistor R3 is connected between terminal P3 and one of terminals P1 and P2, external terminal P3 will form a node of a voltage divider including at least two resistors that divide the voltage between node 88 and the output of operational amplifier 86. Specifically, when resistor R3 is connected between terminal P3 and terminal P1, terminal P3 will form a node of a voltage divider including resistor R2 (which includes resistors DR3 and TF7) and resistor R3, and when resistor R3 is connected between terminal P3 and terminal P2, terminal P3 will form a node of a voltage divider including resistor R1 (which includes resistors DR2 and TF6), resistor R2 (which includes resistors DR3 and TF7), and resistor R3. The voltage at terminal P3 resulting from the voltage division performed by these resistors is represented by curve 82 in FIG. 8. The ability to connect resistor R3 to either of two separate terminals is provided to permit temperature compensation of the device for different types of magnets. For example, the connection of resistor R3 between terminals P1 and P3 may permit the compensation of a −2000 parts-per-million (ppm) magnet and the connection of resistor R3 between terminals P2 and P3 may permit the compensation of a −200 ppm magnet.

After resistor R3 is connected between external terminal P3 and one of external terminals P1 and P2, its value may be trimmed to optimize the slope of curve 82 for the particular application. That is, by adjusting the slope of curve 82, the amount that the voltage at external terminal P3 changes in response to temperature changes will be adjusted. Because the voltage at external terminal P3 controls the magnitude of the Hall current $I_H$ generated by voltage-to-current converter 42 (shown in FIG. 3), optimizing the slope of curve 82 (by trimming resistor R3) will permit compensation of the temperature dependency of the sensitivity $S_H$ of Hall-effect element 20 with a high degree of accuracy.

As mentioned above, each of resistors R1 and R2 includes a series combination of a thin film and a temperature-sensitive diffusion resistor. Diffusion resistors are used in resistors R1 and R2 to add curvature to curve 82 to provide correction for the second-order temperature coefficient of the quad-cell Hall-effect element sensitivity $S_H$.

Figure 9:
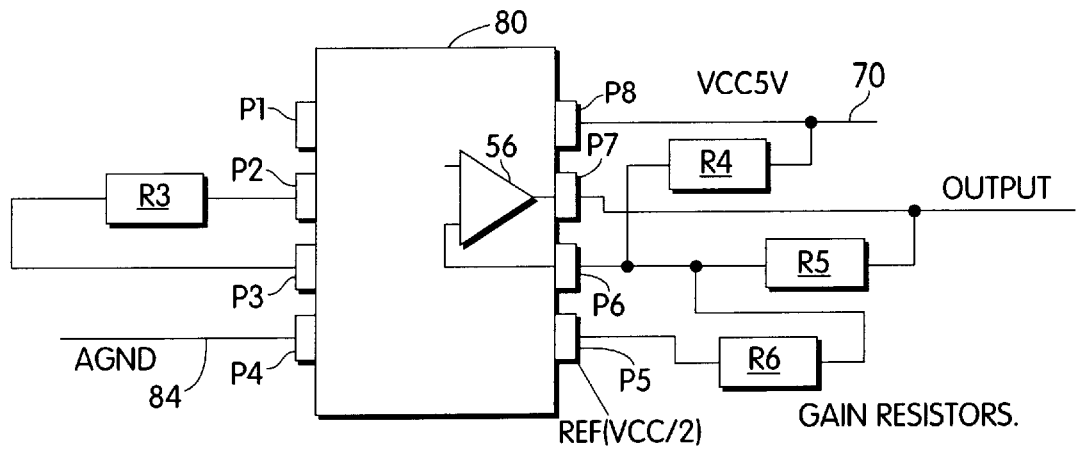
FIG. 9 is partial block/partial schematic diagram showing a possible configuration of circuit elements external to the device.

FIG. 9 is partial block/partial schematic diagram showing a possible embodiment of Hall-effect device 80 and a possible configuration of circuit elements external thereto. In the embodiment shown, Hall-effect device 80 is an 8-pin dual-in-line package (DIP) including terminals (i.e., external connectors) P1–P8, several of which are the same terminals shown in previously-described Figures. Terminal P8 receives power from high-supply conductor 70 and terminal P4 is connected to an analog ground conductor 84. Trimmable resistor R3 is connected between terminials P2 and P3 (or optionally could be connected between terminals P1 and P3). Resistors R4–R6 are configured to set the gain of output amplifier 56. Specifically, resistor R4 is connected between terminals P8 and P6 (which is the inverting input of output amplifier 56), resistor R6 is connected between terminals P6 and P5 (which has a voltage equal to VCC/2 on it), and resistor R5 is connected between terminals P6 and P7 (which is the output of amplifier 56).

Figure 10:
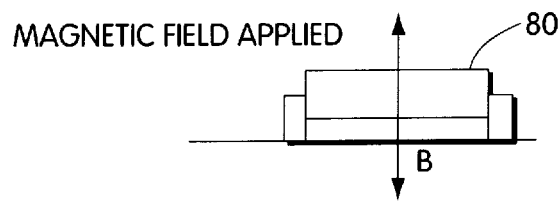
FIG. 10 is a side-view of an embodiment of the device according to the invention showing how the device senses a magnetic field applied thereto.

FIG. 10 is a side-view of an embodiment of Hall-effect device 80 showing how device 80 senses a magnetic field. As shown, the device is configured to sense a magnetic field B oriented transverse to the plane of the device.

Figure 11:
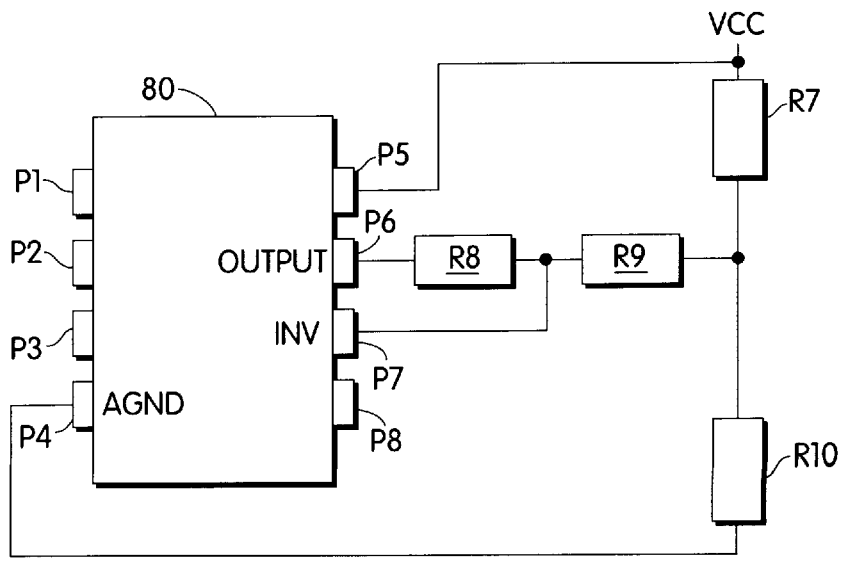
FIG. 11 is partial block/partial schematic diagram showing a possible configuration of circuit elements external to the device.

FIG. 11 is partial block/partial schematic diagram showing another possible configuration of circuit elements external to device 80, wherein an additional potential divider (including resistors R7 and R10) is connected across the supply to further adjust the offset of the device. Specifically, resistor R7 is connected between terminal P5 and a first terminal of resistor R9 (the second terminal of which is connected to terminal P7), resistor R8 is connected between terminal P6 and terminal P7, and resistor R10 is connected between the first terminal of resistor R9 and terminal P3.

While the embodiment of Hall-effect device 80 has been described herein as using, temperature sensitive resistors, any devices capable of producing an output that varies with temperature could equivalently be used without departing from the intended scope of the invention. Additionally, while the temperature-variable current source 22 includes a first device that generates a voltage dependent on temperature and a second device that converts the generated voltage into a current to be supplied to Hall-effect element 20, a single device that produces a temperature-dependent current could equivalently be used, or, alternatively, a temperature-dependent voltage source could be used directly as the source of current across terminal pairs of Hall-effect element 20. Further, while the external device used to adjust the sensitivity of the temperature compensation circuitry has been described herein as a resistor, any other external device capable of adjusting the sensitivity of the device equivalently could be employed. In addition, while the semiconductor components have been described herein as being of particular doping types, opposite doping types equivalently may be used.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A Hall-effect device, comprising:

a Hall-effect element having at least one input for receiving a bias signal and at least one output for providing an output signal dependent on the bias signal and a magnetic field intercepting the Hall-effect element;

at least one output lead to provide an output signal responsive to the output signal of the Hall-effect element and dependent on an overall gain of the Hall-effect device; and a temperature-variable gain control circuit coupled to the Hall-effect element to adjust a sensitivity of the overall gain of the Hall-effect device to temperature changes, the temperature-variable gain control circuit including a pair of nodes and being configured such that, when a first component is coupled between the pair of nodes, changing a characteristic of only the first component alters a sensitivity of the overall gain of the Hall-effect device to temperature changes without altering the overall gain of the Hall-effect device when the Hall-effect device is maintained at a reference temperature.

2. The Hall-effect device as claimed in claim 1, wherein:

the temperature-variable gain control circuit includes a temperature-variable signal source coupled to the Hall-effect element to provide the bias signal thereto such that an amplitude of the bias signal changes in response to temperature changes, the temperature-variable signal source being configured such that, when the first component is coupled between the pair of nodes, changing the characteristic of only the first component alters an amount that the amplitude of the bias signal changes in response to a given temperature change without altering the amplitude of the bias signal when the Hall-effect device is maintained at the reference temperature.

3. The Hall-effect device as claimed in claim 2, wherein the temperature-variable signal source includes:

a controllable current source, having a control input, that provides a bias current as the bias signal to the Hall-effect element, and a temperature-sensitive signal source coupled to the control input of the controllable current source to provide a temperature dependent control signal thereto.

4. The Hall-effect device as claimed in claim 3, wherein:

the controllable current source includes a voltage-controlled current source, and the temperature-sensitive signal source includes a temperature-sensitive voltage source.

5. The Hall-effect device as claimed in claim 4, wherein:

at least one of the pair of nodes forms a node of a potential divider when the first component is coupled therebetween.

6. The Hall-effect device as claimed in claim 5, wherein the first component includes a resistor having an adjustable resistance.

7. The Hall-effect device as claimed in claim 1, wherein the first component includes a resistor having an adjustable resistance.

8. The Hall-effect device as claimed in claim 1, further comprising means for compensating for offset of the Hall-effect element.

9. A Hall-effect device, comprising:

a Hall-effect element having at least one input for receiving a bias signal and at least one output for providing an output signal dependent on the bias signal and a magnetic field intercepting the Hall-effect element;

at least one output lead to provide an output signal responsive to the output signal of the Hall-effect element and dependent on an overall gain of the Hall-effect device; and means, coupled to the Hall-effect element, for enabling a sensitivity of the overall gain of the Hall-effect device to changing temperature conditions to be adjusted by changing a value of only a single component coupled to the means for enabling without altering the overall gain of the Hall-effect device when the Hall-effect device is maintained at a reference temperature.

10. The Hall-effect device according to claim 9, wherein the means for enabling includes means for providing the bias signal to the Hall-effect element such that an amplitude of the bias signal changes responsive to temperature changes.

11. A method for compensating for the effects of temperature variations on a Hall-effect element and/or a magnet generating a magnetic field being measured thereby, comprising steps of:

(a) providing a Hall-effect device including a Hall-effect element and a temperature-variable gain control circuit coupled to the Hall-effect element to adjust a sensitivity of a gain of the Hall-effect device to temperature changes;

(b) coupling a first component between a pair of nodes of the temperature-variable gain control circuit to set the sensitivity of the gain of the Hall-effect device to temperature variations; and (c) altering a characteristic of only the first component to adjust the sensitivity of the gain of the Hall-effect device to temperature variations without altering the gain of the Hall-effect device when the Hall-effect device is maintained at a reference temperature.

12. The method of claim 11, wherein:

the step (a) includes a step of providing a temperature-variable signal source as the temperature-variable gain control circuit, the temperature-variable signal source being coupled to the Hall-effect element to provide a bias signal to at least one input of the Hall-effect element such that an amplitude of the bias signal changes responsive to temperature changes; and the step (b) includes a step of (b1) coupling the first component between the pair of nodes of the Hall-effect device to set a sensitivity of the temperature-variable signal source to temperature variations; and the step (c) includes a step of altering the characteristic of only the first component to adjust an amount that the amplitude of the bias signal changes responsive to a give temperature change without altering the amplitude of the bias signal when the Hall-effect device is maintained at the reference temperature.

13. The Hall-effect device as claimed in claim 1, in combination with the first component.

14. The Hall-effect device as claimed in claim 1, wherein the temperature-variable gain control circuit includes means for adjusting the sensitivity of the overall gain of the Hall-effect device to temperature changes without altering the overall gain of the Hall-effect device when the Hall-effect device is maintained at the temperature.

15. The Hall-effect device as claimed in claim 1, wherein:

the Hall-effect element is configured such that the output signal thereof represents a product of a strength of a magnetic field intercepting the Hall-effect element, an amplitude of the bias signal, and a sensitivity constant of the Hall-effect element, wherein the sensitivity constant of the Hall-effect element changes with temperature changes of the Hall-effect element such that, if the amplitude of the bias signal and the strength of the magnetic field were held constant, a magnitude of the output signal would change in a particular polarity direction as a temperature of the Hall-effect element increased; and the temperature-variable gain control circuit is configured such that, when the first component is coupled between the pair of nodes and the characteristic of the first component has a first value, an amount that the overall gain of the Hall-effect device changes in the particular polarity direction in response to a given increase in temperature is greater than an amount that the overall gain of the Hall-effect device would change in the particular polarity direction in response to the given increase in temperature if the temperature-variable gain control circuit did not alter the overall gain of the Hall-effect device in response to changing temperature conditions.

16. The Hall-effect device as claimed in claim 15, wherein the temperature-variable gain control circuit is configured such that, when the first component is coupled between the pair of nodes and the characteristic of the first component has a second value, the amount that the overall gain of the Hall-effect device changes in the particular polarity direction in response to the given increase in temperature is lesser than the amount that the overall gain of the Hall-effect device would change in the particular polarity direction in response to the given increase in temperature if the temperature-variable gain control circuit did not alter the overall gain of the Hall-effect device in response to changing temperature conditions.

17. The Hall-effect device as claimed in claim 1, wherein:

the Hall-effect element is mounted in an integrated circuit package; and the pair of nodes includes a pair of terminals extending from the integrated circuit package so that the first component can be coupled between the pair of terminals at a location external to the package.

18. The Hall-effect device as claimed in claim 1, further including at least one second component coupled to the temperature-variable gain control circuit, a characteristic of the at least one second component being adjustable to select the reference temperature at which changing the characteristic of only the first component does not alter the overall gain of the Hall-effect device.

19. The Hall-effect device as claimed in claim 2, wherein the temperature-variable signal source is configured and arranged such that, when the first component is coupled between the pair of nodes and the characteristic of the first component has a first value, an amplitude of the bias signal increases as the temperature increases, and is further configured and arranged such that, when the first component is coupled between the pair of nodes and the characteristic of the first component has a second value, the amplitude of the bias signal decreases as the temperature increases.

20. The Hall-effect device as claimed in claim 3, wherein the temperature-sensitive signal source is configured and arranged such that, when the first component is coupled between the pair of nodes and the characteristic of the first component has a first value, the temperature-sensitive signal source provides the temperature-dependent control signal to the control input of the controllable current source such that an amplitude of the bias current increases as the temperature increases, and is further configured and arranged such that, when the first component is coupled between the pair of nodes and the characteristic of the first component has a second value, the temperature-sensitive signal source provides the temperature-dependent control signal to the control input of the controllable current source such that the amplitude of the bias current decreases as the temperature increases.

21. The Hall-effect device as claimed in claim 2, wherein the temperature-variable signal source includes a current source that provides a bias current as the bias signal to the Hall-effect element.

22. The Hall-effect device as claimed in claim 5, wherein:
the temperature-sensitive voltage source includes an inverting amplifier that inverts a non-inverted temperature-dependent voltage to create an inverted temperature-dependent voltage; and
the potential divider is coupled between a first node having the non-inverted temperature-dependent voltage thereon and a second node having the inverted temperature-dependent voltage thereon.

23. The Hall-effect device as claimed in claim 10, wherein the means for providing the bias signal to the Hall-effect element includes means for selectively increasing the amplitude of the bias signal as the temperature increases, and means for selectively decreasing the amplitude of the bias signal as the temperature increases.

24. The method of claim 11, wherein the Hall-effect device is included in an integrated circuit, and wherein the step (b) includes a step of coupling the first component between a pair of external terminals of the integrated circuit to set the sensitivity of the gain of the Hall-effect device to temperature variations.

25. The method of claim 12, wherein the Hall-effect device is included in an integrated circuit, and wherein the step (b) includes a step of coupling the first component between a pair of external terminals of the integrated circuit to set the sensitivity of the temperature-variable signal source to temperature variations.

26. A Hall-effect device, comprising:
a Hall-effect element having at least one input for receiving a bias signal and at least one output for providing an output signal, the output signal representing a product of a strength of a magnetic field intercepting the Hall-effect element, an amplitude of the bias signal, and a sensitivity constant of the Hall-effect element, wherein the sensitivity constant of the Hall-effect element changes with temperature changes of the Hall-effect element such that, if the amplitude of the bias signal and the strength of the magnetic field were held constant, a magnitude of the output signal would change in a particular polarity direction as a temperature of the Hall-effect element increased;
at least one output lead to provide an output signal responsive to the output signal of the Hall-effect element and dependent on an overall gain of the Hall-effect device; and
a temperature-variable gain control circuit coupled to the Hall-effect element, the temperature-variable gain control circuit including at least one pair of nodes between which at least one component can be coupled to set a sensitivity of the overall gain of the Hall-effect device to changing temperature conditions, the temperature-variable gain control circuit being configured such that, when the at least one component is coupled between the at least one pair of nodes and a characteristic of at least the at least one component has a first value, an amount that the overall gain of the Hall-effect device changes in the particular polarity direction in response to a given increase in temperature is greater than an amount that the overall gain of the Hall-effect device would change in the particular polarity direction in response to the given increase in temperature if the temperature-variable gain control circuit did not alter the overall gain of the Hall-effect device in response to changing temperature conditions.

27. The Hall-effect device as claimed in claim 26, wherein the temperature-variable gain control circuit is configured such that, when the at least one component is coupled between the at least one pair of nodes and the characteristic of the at least one component has a second value, the amount that the overall gain of the Hall-effect device changes in the particular polarity direction in response to the given increase in temperature is lesser than the amount that the overall gain of the Hall-effect device would change in the particular polarity direction in response to the given increase in temperature if the temperature-variable gain control circuit did not alter the overall gain of the Hall-effect device in response to changing temperature conditions.

28. The Hall-effect device as claimed in claim 27, wherein:
the Hall-effect element and the temperature-variable gain control circuit are included in an integrated circuit package; and
the at least one pair of nodes includes at least one pair of terminals extending from the integrated circuit package so that the at least one component can be coupled between the at least one pair of terminals at a location external to the package.

29. The Hall-effect device as claimed in claim 26, wherein:
the Hall-effect element and the temperature-variable gain control circuit are included in an integrated circuit package; and
the at least one pair of nodes includes at least one pair of terminals extending from the integrated circuit package so that the at least one component can be coupled between the it least one pair of terminals at a location external to the package.

30. The Hall-effect device as claimed in claim 26, wherein:

the temperature-variable gain control circuit includes a temperature-variable signal source coupled to the Hall-effect element to provide the bias signal thereto such that that, when the at least one component is coupled between the at least one pair of nodes, an amplitude of the bias signal changes in response to temperature changes in the Hall-effect device.

31. The Hall-effect device as claimed in claim 27, wherein:

the temperature-variable gain control circuit includes a temperature-variable signal source coupled to the Hall-effect element to provide the bias signal thereto such that that, when the at least one component is coupled between the at least one pair of nodes, an amplitude of the bias signal changes in response to temperature changes.

32. The Hall-effect device as claimed in claim 31, wherein the temperature-variable signal source includes:

a controllable current source, having a control input, that provides a bias current as the bias signal to the Hall-effect element, and a temperature-sensitive signal source coupled to the current source to provide a temperature-dependent control signal to the control input of the controllable current source, the temperature-sensitive signal source being configured such that, when the at least one component is coupled between the at least one pair of nodes, an amplitude of the temperature-dependent control signal changes as the temperature of the Hall-effect device changes, thereby causing the amplitude of the bias current to change as the temperature of the Hall-effect device changes.

33. The Hall-effect device as claimed in claim 26, wherein:

the temperature-variable signal source includes a current source that provides a bias current as the bias signal to the Hall-effect element; and the temperature-variable signal source is configured and arranged such that, when the at least one component is coupled between the at least one pair of nodes and the characteristic of the at least one component has a first value, the amplitude the bias current increase as the temperature increases, and is further configured and arranged such that, when the at least one component is coupled between the at least one pair of nodes and the characteristic of the at least one component has a second value, the amplitude of the bias current decreases as the temperature increases.

34. The Hall-effect device as claimed in claim 27, wherein:

the temperature-variable signal source includes a current source that provides a bias current as the bias signal to the Hall-effect element; and the temperature-variable signal source is configured such that, when the at least one component is coupled between the at least one pair of nodes, an amplitude the bias current changes as the temperature changes.

35. The Hall-effect device as claimed in claim 32, wherein:

the controllable current source includes a voltage-controlled current source, and the temperature-sensitive signal source includes a temperature-sensitive voltage source.

36. The Hall-effect device as claimed in claim 35, wherein:

the at least one component includes a resistor;

the temperature-sensitive signal source is configured such that, when the resistor is coupled between the at least one pair of nodes, the resistor is included in a voltage divider; and the temperature-sensitive control signal is taken from a node of the voltage divider.

37. The Hall-effect device as claimed in claim 36, wherein:

the temperature-sensitive voltage source includes an inverting amplifier that inverts a non-inverted temperature-dependent voltage with respect to a reference voltage to create an inverted temperature-dependent voltage; and the temperature-sensitive signal source is configured such that, when the resistor is coupled between the at least one pair of nodes, the voltage divider is coupled between a first node having the non-inverted temperature-dependent voltage thereon and a second node having the inverted temperature-dependent voltage thereon.

38. The Hall-effect device as claimed in claim 26, wherein:

the temperature-variable gain control circuit includes an inverting amplifier that inverts a non-inverted temperature-dependent voltage with respect to a reference voltage to create an inverted temperature-dependent voltage;

the at least one component includes a resistor; and the temperature-variable gain control circuit is configured such that, when the resistor is coupled between the at least one pair of nodes, the resistor is included in a voltage divider coupled between a first node having the non-inverted temperature-dependent voltage thereon and a second node having the inverted temperature-dependent voltage thereon, the sensitivity of the overall gain of the Hall-effect device being adjusted in response to a voltage at a node of the voltage divider.

39. The Hall-effect device as claimed in claim 27, wherein:

the temperature-variable gain control circuit includes an inverting amplifier that inverts a non-inverted temperature-dependent voltage with respect to a reference voltage to create an inverted temperature-dependent voltage;

the at least one component includes a resistor; and the temperature-variable gain control circuit is configured such that, when the resistor is coupled between the at least one pair of nodes, the resistor is included in a voltage divider coupled between a first node having the non-inverted temperature-dependent voltage thereon and a second node having the inverted temperature-dependent voltage thereon, the sensitivity of the overall gain of the Hall-effect device being adjusted in response to a voltage at a node of the voltage divider.

40. The Hall-effect device as claimed in claim 26, wherein the temperature-variable gain control circuit includes means for adjusting the sensitivity of the overall gain of the Hall-effect device to changing temperature conditions.

41. A Hall-effect device, comprising:

a Hall-effect element having at least one input for receiving a bias signal and at least one output for providing an output signal dependent on the bias signal and a magnetic field intercepting the Hall-effect element;

a variable signal source coupled to the Hall-effect element to provide the bias signal thereto; and means for selectively increasing an amplitude of the bias signal as a temperature of the Hall-effect device increases, and for selectively decreasing the amplitude of the bias signal as the temperature of the Hall-effect device increases.

42. The Hall-effect device as claimed in claim 41, further including:

at least one output lead to provide an output signal responsive to the output signal of the Hall-effect element and dependent on an overall gain of the Hall-effect device; and means for adjusting at least one of the means for increasing and means for decreasing the amplitude of the bias signal to alter a sensitivity of the overall gain of the Hall-effect device to changing temperature conditions.

43. A Hall-effect device, comprising:

a Hall-effect element having at least one input for receiving a bias signal and at least one output for providing an output signal dependent on the bias signal and a magnetic field intercepting the Hall-effect element;

at least one output lead to provide an output signal responsive to the output signal of the Hall-effect element and dependent on an overall gain of the Hall-effect device;

a voltage divider having at least first, second, and third nodes, a voltage at the second node of the voltage divider representing a particular proportion of a difference between voltages at the first and third nodes of the voltage divider;

a temperature-sensitive voltage source to provide an output voltage responsive to temperature changes, the temperature-sensitive voltage source being coupled to the first node of the voltage divider to provide the output voltage thereto; and a gain control circuit coupled to the Hall-effect element to, in response to a control voltage, adjust a sensitivity of the overall gain of the Hall-effect device to temperature changes, the gain control circuit being coupled to the second node of the voltage divider to receive the control voltage therefrom.

44. The Hall-effect device of claim 43, further including an inverting amplifier coupled to the temperature-sensitive voltage source to receive and invert the output voltage of the temperature-sensitive voltage source with respect to a reference voltage to create an inverted voltage, the inverting amplifier being further coupled to the third node of the voltage divider to provide the inverted voltage thereto.

45. The Hall-effect device of claim 44, wherein the gain control circuit includes a signal source that provides the bias signal to the Hall-effect element such that an amplitude of the bias signal changes in response to changing temperature conditions.

46. The Hall-effect device of claim 45, wherein the signal source includes a voltage-controlled current source that provides a bias current as the bias signal to the Hall-effect element.

47. The Hall-effect device of claim 43, wherein the gain control circuit includes a signal source that provides the bias signal to the Hall-effect element such that an amplitude of the bias signal changes in response to changing temperature conditions.

48. The Hall-effect device of claim 47, wherein the signal source includes a voltage-controlled current source that provides a bias current as the bias signal to the Hall-effect element.

* * * * *